United States Patent
Thomas et al.

(10) Patent No.: US 7,402,911 B2
(45) Date of Patent: Jul. 22, 2008

(54) MULTI-CHIP DEVICE AND METHOD FOR PRODUCING A MULTI-CHIP DEVICE

(75) Inventors: Jochen Thomas, München (DE); Wolfgang Hetzel, Nattheim (DE)

(73) Assignee: Infineon Technologies AG, Munich (DE)

( * ) Notice: Subject to any disclaimer, the term of this patent is extended or adjusted under 35 U.S.C. 154(b) by 211 days.

(21) Appl. No.: 11/168,820

(22) Filed: Jun. 28, 2005

(65) Prior Publication Data
US 2006/0290005 A1    Dec. 28, 2006

(51) Int. Cl.
*H01L 23/48* (2006.01)
*H01L 23/52* (2006.01)
*H01L 23/02* (2006.01)
*H01L 23/34* (2006.01)

(52) U.S. Cl. .............. 257/777; 257/678; 257/690; 257/713

(58) Field of Classification Search .............. 257/777, 257/678, 690, 713, 723, 686
See application file for complete search history.

(56) References Cited

U.S. PATENT DOCUMENTS 6,531,784 B1 * 3/2003 Shim et al. ............... 257/777
7,205,656 B2 * 4/2007 Kim et al. ................. 257/723

* cited by examiner

*Primary Examiner*—Chuong A. Luu
(74) *Attorney, Agent, or Firm*—Patterson & Sheridan, L.L.P.

(57) ABSTRACT

The present invention relates to a multi-chip device comprising a substrate having a first surface on which a number of first contact elements is provided, a plurality of integrated circuit chips arranged in a chip stack which is arranged on a second surface of the substrate opposing the first surface, wherein each of the chips having a surface on which a number of second contact elements are provided, wherein a first one of the chips and the second contact elements thereon is arranged such that its second contact elements are uncovered by any of the chips or by the substrate and face towards the second surface of the substrate; and connecting elements which are arranged such as to connect at least one of the first contact elements of the substrate and at least one of the second contact elements of the first chip.

13 Claims, 3 Drawing Sheets

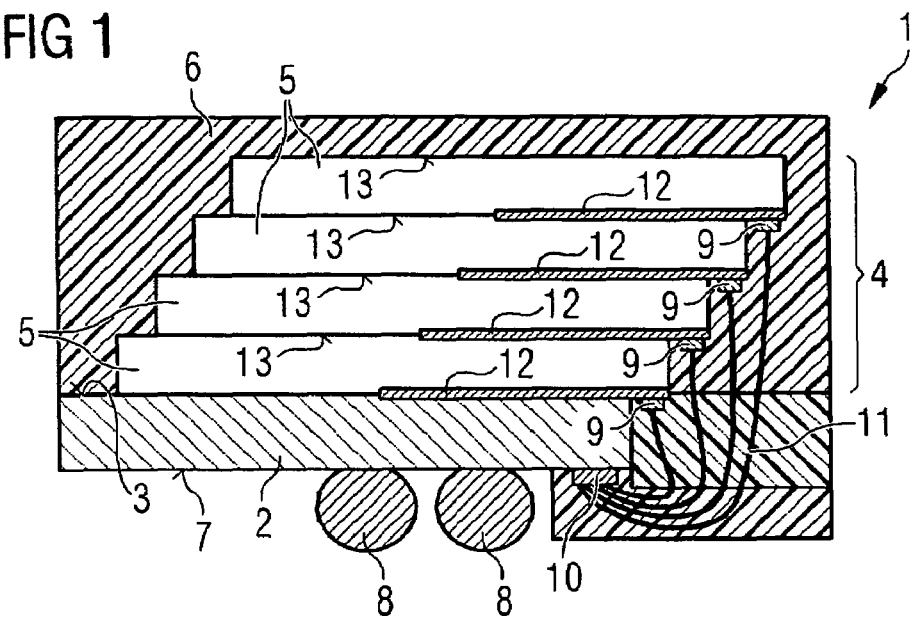
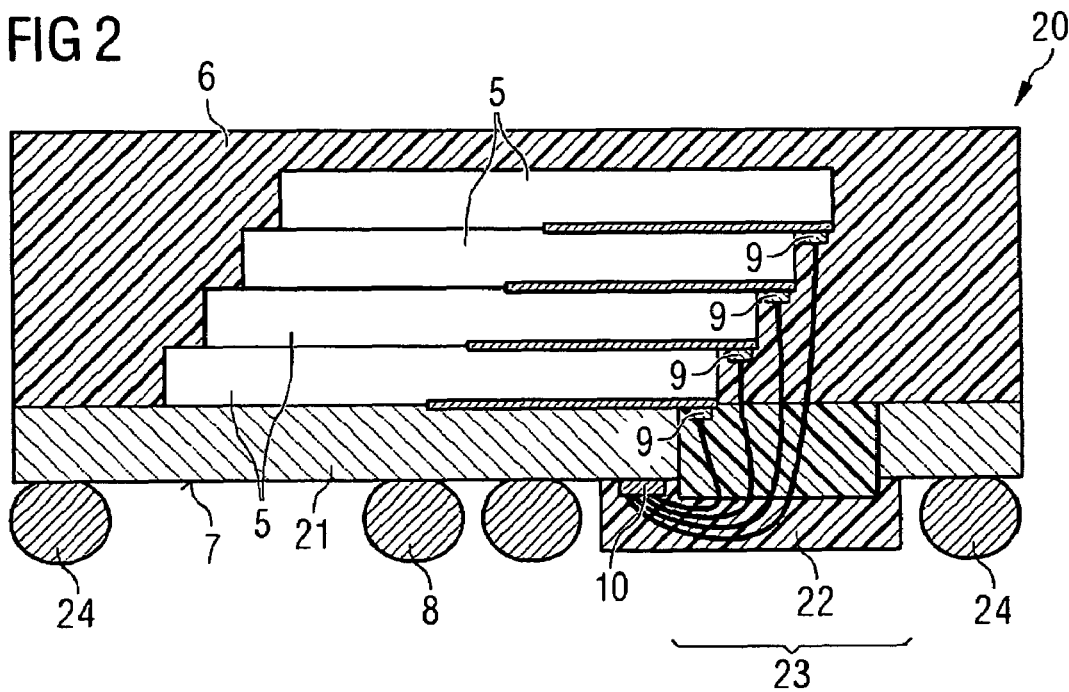

MULTI-CHIP DEVICE AND METHOD FOR PRODUCING A MULTI-CHIP DEVICE

BACKGROUND OF THE INVENTION

1. Field of the Invention

The present invention relates to a multi-chip device and a method for producing a multi-chip device.

2. Description of the Related Art

Memory storage capacity is usually provided by memory devices. To fulfill the market demands for higher storage density, memory devices have evolved into multi-chip devices (also referred to as multi-chip packages or MCPs) containing more than one memory chip in a single package. Because the increase of the memory density of memory chips may be limited, combining a plurality of memory chips in multi-chip memory devices may provide an efficient way to increase the density of memory devices according to the market demands. Also, for devices other than memory devices, an increased system density may be required such that a number of separately fabricated chips may be integrated into one device package.

In some cases, the integration of chips in a multi-chip device uses chip stacks. The single chips of the chip stack may be spaced apart from each other in order to provide a secure access to the contact pads of each chip by means of bonding equipment which may attach bond wire. The spacing between the chips may increase the total height of the chip stack and thereby may limit the number of stacked chips, for instance, due to size requirements of the package and bond wires or due to the stability of the multi-chip device.

In some cases, a multi-chip device may have a substrate with contact pads on a first surface on which two or more chips are stacked. Each of the stacked chips may have uncovered contact pads on a surface facing away from the first surface of the substrate. The stacked chips may be stacked in such a way that their contact pads are accessible by the bonding equipment. The bonding equipment may bond the contact pads on the first surface of the substrate to the contact pads of the respective stacked chips. The bond wire may require a spacing between the single chips of the chip stack, and the spacing for the bond wire may affect the overall height of the device. In some cases, the substrate contact pads may be placed on a portion of the first surface of the substrate which is uncovered by the chip stack. The area provided for the substrate contact pads may be limited. Thus, the overall number of contact pads on the first surface of the substrate may be limited, as well.

Accordingly, what is needed is a multi-chip package and a method for producing such a package which has a reduced height, allows for the stacking of an increased number of chips of a given total height, and/or allows for an increased number of contact pads on the substrate.

SUMMARY OF THE INVENTION

A multi-chip device and method of manufacturing the multi-chip device is provided.

One embodiment provides a method of forming multi-chip packages. The method generally includes positioning a first integrated circuit in a face-down position over a substrate, the substrate having opposing first and second surfaces, wherein a first surface of the first integrated circuit and the first surface of the substrate are in facing relationship with respect to one another and a second surface of the integrated circuit faces away from the substrate, positioning at least a portion of a second integrated circuit face-down over at least a portion of the first integrated circuit so that the second surface of the first integrated circuit is facing at least a portion of a first surface of the second integrated circuit, coupling a first plurality of contact pads disposed on the first surface of the first integrated circuit to a first plurality of contact pads disposed on the second surface of the substrate, and coupling a second plurality of contact pads disposed on the first surface of the second integrated circuit to a second plurality of contact pads disposed on the second surface of the substrate.

Another embodiment provides a multi-chip package generally including a substrate, first and second integrated circuits and electrical conductors. The substrate has opposing first and second surfaces and a plurality of contact areas disposed on the second surface of the substrate. The first integrated circuit is positioned in a face-down position over the substrate, wherein a first surface of the first integrated circuit and the first surface of the substrate are in facing relationship with respect to one another, a second surface of the integrated circuit faces away from the substrate, and the first integrated circuit comprises a first plurality of contact pads disposed on the first surface of the first integrated circuit. The second integrated circuit is positioned face-down over at least a portion of the first integrated circuit, wherein the second surface of the first integrated circuit is facing at least a portion of a first surface of the second integrated circuit and the second integrated circuit comprises a second plurality of contact pads disposed on the first surface of the second integrated circuit. The electrical conductors couple the first and second plurality of contact pads to the plurality of contact areas disposed on the second surface of the substrate.

Another embodiment provides a multi-chip package generally including a substrate, first and second integrated circuits and electrical conductors. The substrate has opposing first and second surfaces, a through-channel extending through the first surface to the second surface, and a plurality of contact areas disposed on the second surface of the substrate. The first integrated circuit is in a face-down position over the substrate, wherein a first surface of the first integrated circuit and the first surface of the substrate are in facing relationship with respect to one another, a second surface of the integrated circuit faces away from the substrate, and the first integrated circuit comprises a first plurality of contact pads disposed on the first surface of the first integrated circuit. The second integrated circuit is positioned face-down over at least a portion of the first integrated circuit, wherein the second surface of the first integrated circuit is facing at least a portion of a first surface of the second integrated circuit, and the second integrated circuit comprises a second plurality of contact pads disposed on the first surface of the second integrated circuit. The electrical conductors coupling the first and second plurality of contact pads to the plurality of contact areas disposed on the second surface of the substrate, wherein the electrical conductors pass through the through-channel.

Another embodiment provides a multi-chip package generally including a substrate, first and second integrated circuits and electrical conductors. The substrate has opposing first and second surfaces, a first plurality of contact areas disposed on the second surface of the substrate, and a second plurality of contact areas disposed on the second surface of the substrate. The first integrated circuit is in a face-down position over the substrate, wherein a first surface of the first integrated circuit and the first surface of the substrate are in facing relationship with respect to one another, wherein a second surface of the integrated circuit faces away from the substrate, and the first integrated circuit comprises a first plurality of contact pads disposed on the first surface of the first integrated circuit. The second integrated circuit is positioned face-up over at least a portion of the substrate, wherein the first surface of the substrate is facing at least a portion of a first surface of the second integrated circuit and the second integrated circuit comprises a second plurality of contact pads disposed on a second surface of the second integrated circuit. First electrical conductors couple the first plurality of contact pads to the first plurality of contact areas underneath the substrate. Second electrical conductors coupling the second plurality of contact pads to the second plurality of contact areas

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 shows a cross-sectional view of a multi-chip device according to one embodiment of the present invention;

FIG. 2 shows a multi-chip device having a through-channel according to one embodiment of the present invention;

DETAILED DESCRIPTION OF THE PREFERRED EMBODIMENT

Figure 3:
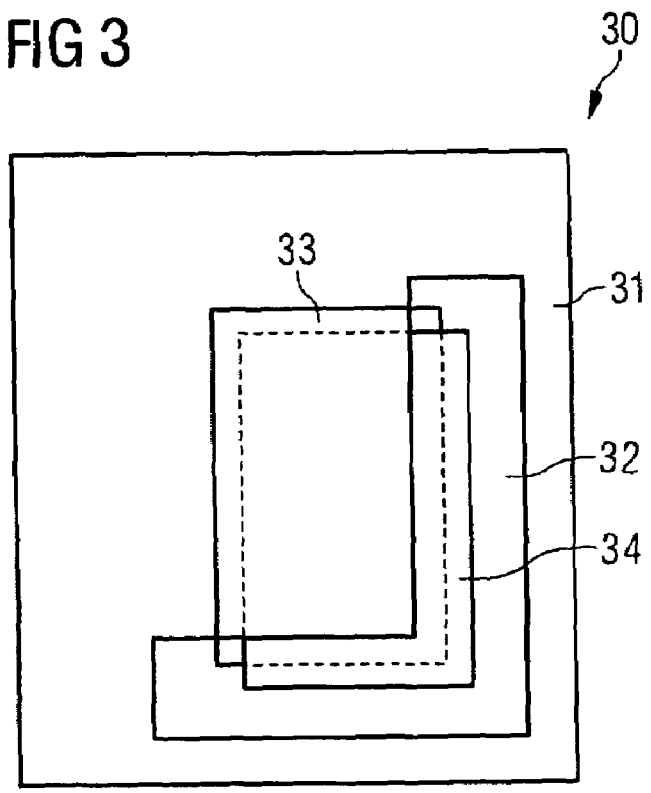
FIG. 3 shows a top view of a multi-chip device according to one embodiment of the present invention.

Embodiments of the invention generally provide multi-chip devices and methods of manufacturing the same.

While described below with respect to two or more memory devices in a multi-chip package, embodiments of the invention may be used to effect with any multi-chip package. The chips may be of the same type (e.g., both DRAMs) or different types. Likewise, the geometries may be different or the same in any given MCP. Although embodiments are described with respect to stacks having two dies (ICs) or four dies, any number of dies is contemplated. Furthermore, as used in this detailed description, directional terms such as, for example, upper, middle, lower, top, bottom, and over are used for convenience to describe a multi-chip package relative to one frame of reference regardless of how the multi-chip package may be oriented in space.

In FIG. 1, a cross-sectional view of a multi-chip device 1 according to one embodiment of the present invention is illustrated. The multi-chip device 1 comprises a substrate 2. A chip stack 4 including one or more stacked integrated circuit chips 5 may be attached on a first surface 3 of the substrate 2. The first surface 3 of the substrate 2 may also be referred to as the top of the substrate 2 or the first face of the substrate. A second surface 7 opposite to the first surface 3 of the substrate 2 may have a number of contact pads 10 formed thereon. The second surface 7 may also be referred as the bottom of the substrate 2 or the second face of the substrate 2.

In some cases, the substrate 2 and the chip stack 4 may be molded in a mold 6 such that the chips 5 are encapsulated to provide a protection package. The second surface 7 of the substrate 2 may be uncovered by the mold 6 and contacting elements 8, for example, in the form of solder balls or bumps, may be provided thereon which may allow electrical connections between the stacked chips 5 in the multi-chip device 1 and a circuit on which the multi-chip device is mounted, e.g., another device or a printed circuit board (PCB, also referred to as a system board).

The chips 5 may have at least one active surface 13 on which integrated circuit structures (not shown) are disposed. The integrated circuit structures may be arranged in such a way that they are electrically connectable.

According to one embodiment, the chips 5 may be each arranged in the chip stack such that the active surface 13 faces towards the first surface 3 of the substrate 2. In other words, the chips 5 may be arranged top-side down on the substrate 2.

In one embodiment, the chips 5 may be stacked on the substrate 2 so that a contact region of each of the chips 5 including at least a contact pad 9 is freely accessible. For instance, as depicted in FIG. 1, the chips 5 may be arranged in a cascaded manner so that the contact region of a first one of the chip which is arranged closest to the substrate 2 may extend beyond one edge of the substrate 2; the contact region of a second one of the chips which is located above the first chip may extend beyond an edge of the first chip 5; the contact region of a third one of the chips 5 which is located above the second chip may extend beyond an edge of the second chip; and a contact region of a fourth one of the chips 5 which is located above the third chip 5 may extend beyond an edge of the third chip.

Thus, the contact regions of each of the chips 5 may, in some cases, extend beyond the edge of the substrate 2. Consequently, each of the chips may have a contact region in which the contact pads 9 are uncovered by the other chips and the substrate. Also, because, the multi-chip device may provide the first contact elements on the surface of the substrate opposing the surface on which the chip stack is attached. Thus, in some cases, the region of the surface of the substrate in which the first contact elements can be provided may not be limited by the area which is needed for the attachment of the chip stack.

The contact pads 10 on the second surface 7 of the substrate 2 are electrically bonded with the contact pads 9 of the chips 5. In some cases, the bonding may be performed by bond wires 11 which are bonded between one of the contact pads 10 of the substrate 2 and one of the contact pads 9 of one of the chips 5 by means of a bonding process. In some cases, the mold 6 applied thereafter may surround and isolate the bonding wires 11 and extend beyond the size of the substrate 2, to protect the bonding wires against environmental influences.

In one embodiment, to provide an electrical connection between the contact pads 9 and the integrated circuits of the respective chips 5 each chip 5 may comprise a redistribution layer 12 which is provided on the active surface on the respective chip 5. In one embodiment, the chips 5 shown in FIG. 1 may be memory chips having an integrated contact pad row (not shown) arranged in the middle of the chip 5, the contact pads of which have to be selectively connected to the contact pads 9 in the contact region of the respective chip 5 such that the memory circuits (not shown) can be addressed via electrical signals applied on the contact pads 9.

The number of the chips 5 stacked in the embodiment shown in FIG. 1 is not restricted to four and any number of chips that can ideally be stacked and connected to respective contact pads 10 on the second surface 7 of the substrate 2.

In one embodiment, a further number of the chips may be stacked with the chips 5 as shown in the embodiment of FIG. 1. The further number of chips may be cascaded in a direction perpendicular to the direction in which the chips 5 are cascaded. Thus, the further number of chips may overhang another edge of the substrate 2, perpendicular to the first. For example, with respect to FIG. 1, one or more chips may be a cascaded perpendicularly to the shown cross-sectional plane such that a bonding to respective contact pads 10 arranged close to the edge and to the further (adjacent) edge of the substrate 2 can be performed, thereby limiting the required length of the bond wires 11.

In one embodiment of the invention, the contact pads 10 may be electrically connected to the contacting elements 8 via a further redistribution layer (not shown) which may be integrated in or on the substrate 2. Thereby, the chips 5 of the chip stack 4 may be electrically addressed by signals applied on the contacting elements 8.

In another embodiment, the multi-chip device may have a substrate which includes a through-channel in a through-channel region of the substrate, wherein connections from the substrate to the chips extend through the through-channel in the substrate. FIG. 2 depicts a multi-chip device 20 having a through-channel according to one embodiment of the present invention. The multi-chip device 20 of FIG. 2 includes the substrate 21 which has a through-channel 22 in a through-channel region 23 which is formed as a recess (via) in the substrate 21. The chips 5 of the chip stack 4 may be cascaded in the same manner as described with regard to the embodiment of FIG. 1.

According to one embodiment of the invention, the through-channel 22 in the substrate 21 may have the advantage that the connecting element, i.e. the bond wires 11, connected to the connection pads 10 on the substrate 21 and the connection pads 9 on the chips 5 may pass through the through-channel 22 in the substrate 21. Accordingly, the bond wires 11 may be secured against external mechanical influences.

According to one embodiment, the chips may be cascaded so as to extend beyond an edge formed by the through-channel 22 of the substrate 21 into the through-channel region 23. For example, the edge of the contact region of the first chip 5 which is closest to the substrate may extend beyond the edge of substrate formed by the through-channel 22 (in other words, the edge of the through-channel or via). The edge of the contact region may thus extend into the through-channel region. Similarly, the contact region of the second chip 5 which is arranged above the first chip 5 may extend beyond the edge of the first chip and also beyond the edge of the through-channel 23, into the through-channel region of the substrate 21. The contact region of the third chip 5 which is arranged above the second chip 5 may extend beyond an edge of the second chip 5 and over the edge of the through-channel 23, into the through-channel region 23. The contact region of the fourth chip 5 which is arranged above the third chip may also extend beyond the edge of the third chip 5 and over the through-channel edge 23 into the through-channel region 23. Thereby, the contact pads 9 of the chips 5 of the chip stack 4 can be accessed by a bonding equipment in such a way that bond wires are led through the through-channel 22 such as to provide a bonding between the contact pads 10 on the second surface 7 of the substrate 21 and the contact pads 9 in the contact regions of the chips 5.

According to one embodiment, the substrate 21 may further comprise support elements 24 which can be formed as contacting elements, e.g., solder balls, which may allow soldering of the multi-chip device 20 onto a system board, whereby the support element may function as a mechanical fixture for the multi-chip device 20 on the system board. According to one embodiment of the invention, the support elements 24 may be mechanically attached to substrate 21 and system board but may not electrically connect the substrate 21 and the system board. According to another embodiment, the support elements 24 may both electrically and mechanically connect the substrate 21 to the system board.

As previously described with respect to FIG. 1, it may also be possible to provide a cascade in two directions as illustrated in FIG. 3. FIG. 3 shows a top view of a multi-chip device 30 according to one embodiment of the present invention. The multi-chip device 30 of the embodiment of FIG. 3 shows a substrate 31 having a through-channel region 32 which is formed with an L-shape into which two or more chips stacked upon each other may extend. For ease of illustration, only two chips 33, 34 are shown forming the chip stack. As it can be seen from FIG. 3, chips 33, 34 are arranged in a cascaded manner such the chip stack provides a cascade for each leg of the L-shaped through-channel region 32. The contacts of the chips 33, 34 may be arranged perpendicularly as already described with respect to FIG. 2, wherein the contact regions of the chip in which the contact pads 9 are arranged can extend into each of the legs (or channels) of the L-shaped through-channel region 32 or both. The respective contact pads 10 on the substrate 31 may be arranged on one side or on both sides of the L-shaped through-channel region 32 close to the respective edge on the first surface 3 of the substrate 31.

Figure 4:
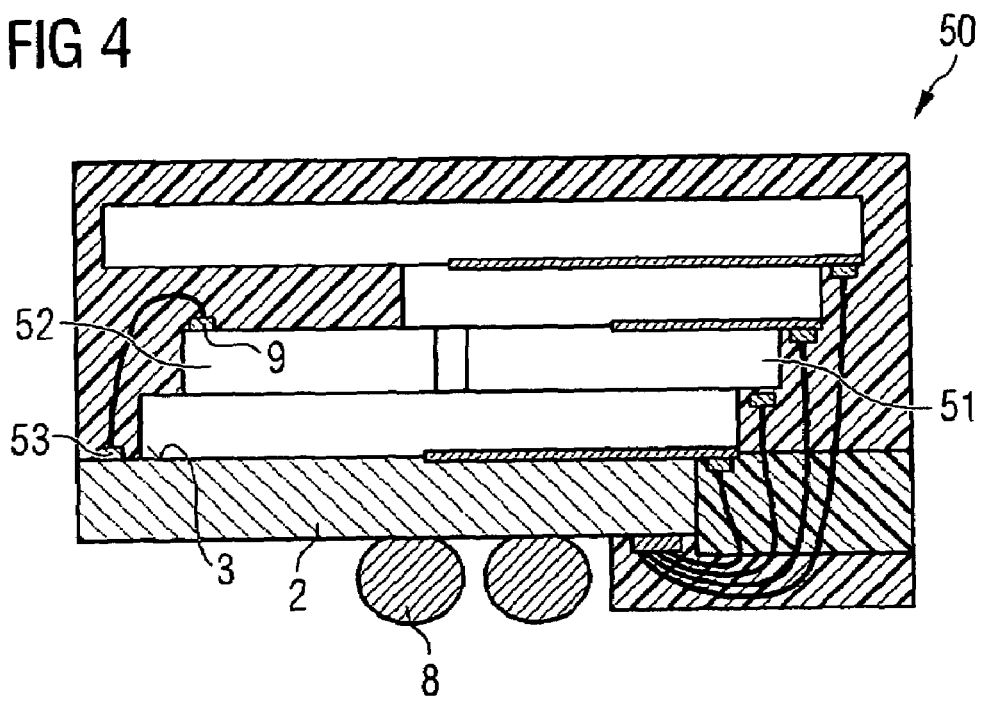
FIG. 4 depicts a cross-sectional view of a multi-chip device having a layer including two or more chips according to one embodiment of the present invention.

According to one embodiment of the invention, a multi-chip device may include a chip stack formed by stacking the chips onto each other, wherein the chip stack comprises at least one layer including two or more of the plurality of chips, which are arranged side by side with regard to the direction perpendicular to one of the chip stack. FIG. 4 depicts a multi-chip device 50 having a layer including two or more chips according to one embodiment of the present invention.

The chip stack 4 of the embodiment of FIG. 4 may comprise a layer in which a first and a second chip 51, 52 are arranged side by side with regard to the direction perpendicular to the direction of the stacked chips. The first and second chips 51, 52 of this layer may have their active surfaces on different sides so that the first chip 51 of the layer has a contact region which faces towards the first surface 3 of the substrate 2 and the second chip 52 in the respective layer has its contact region including the contact pads 9 facing away from the first surface 3 of the substrate 2.

According to one embodiment of the invention, one or more contact pads 53 on the first surface 3 of the substrate may be arranged besides the location on which the chip stack is attached. In one embodiment, the substrate may also comprise a redistribution element to provide interconnections between the contact pads 53 on the first surface 3 of the substrate 2 and the contact pads on the second surface of the substrate 2. Thus, the multi-chip device may have contact elements on both surfaces of the substrate 2 by which the total number of contact elements for contacting the chips 51, 52 of the attached chip stack can be enormously increased. As depicted, a part of the chips of the chip stack may be bonded to the contact elements on the first surface and another part of the number of the chips of the chip stack may be bonded to contact elements of the second surface 7 of the substrate 2.

The contact pads 9 of the second chip 52 may be bonded to the contact pads 53 on the first surface 3 of the substrate 2. As they face in the same direction, a common bonding equipment can be used to provide the bond wires for connection. This allows for the chips 51, 52 in the chip stack 4 to have a different orientation so that one set of the chips 5 may be bonded to the contact pads 10 on the second surface of the substrate 2 and another set of the chips 5 may be bonded to the contact pads 53 on the first surface 3 of the substrate 2. Thereby, the number of chips which can be connected to a substrate 2 can be increased as the area for placing contact pads on the substrate 2 can be increased. To connect the contact pads 53 to the contact elements, an appropriate redistribution structure (not shown) may be provided in the substrate 2.

According to one embodiment of the invention, the embodiment depicted in FIG. 4 may be utilized with the through-channel 22 depicted in FIG. 2. In other words, according to one embodiment, bonding wires may connect the first chip 51 to the substrate 2 through a through-channel.

Figure 5A:
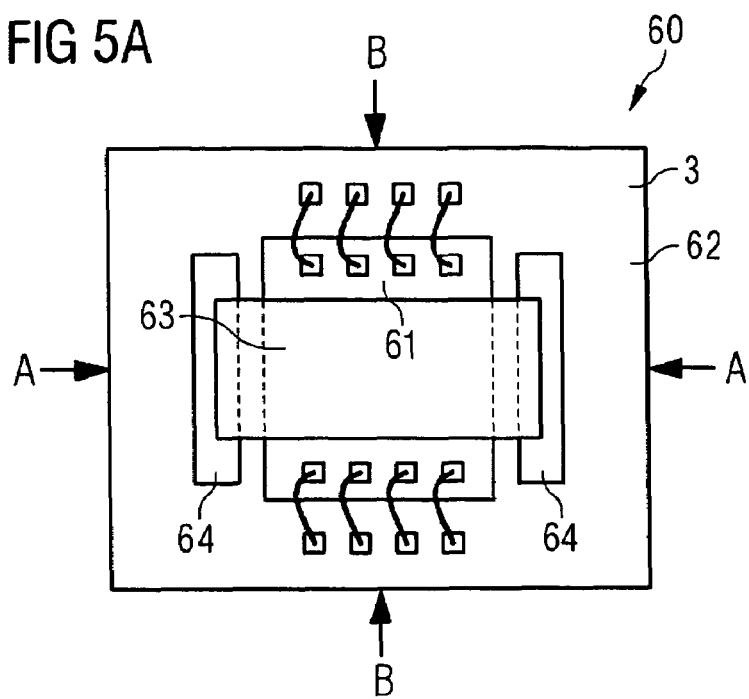
FIG. 5A shows a top-side view of a multi-chip device having two stacked chips according to one embodiment of the present invention.
Figure 5B:
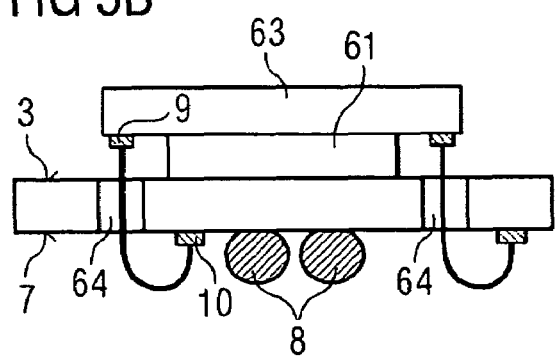
FIG. 5B shows a cross-sectional view along the line A-A of the multi-chip device of FIG. 5A according to one embodiment of the present invention.
Figure 5C:
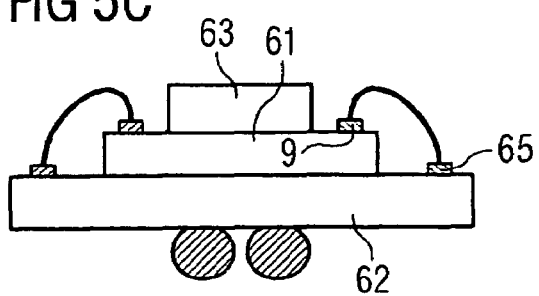
FIG. 5C shows a cross-sectional view of the multi-chip device of FIG. 5A across the line B-B according to one embodiment of the present invention.

FIGS. 5A to 5C depict a multi-chip device according to another embodiment of the invention. In FIG. 5a, a top view of a multi-chip device 60 is shown having a chip stack which includes two rectangular chips 61, 63 (for ease of illustration) the first chip 61 of which is arranged on the substrate 62. The second chip 63 is stacked on the first chip 61 such that the chips 61, 63 are stacked in a cross-wise manner such that each chip 61, 63 extends beyond two opposing edges of the respective other chip. The portion of the second chip 63 which extends beyond the first chip 61 also extends on both sides over the edge of a through-channel 64 into the through-channel region. The portion of the second chip 63 which extends into the through-channel region 64 may have its active surface facing towards the first surface 3 of the substrate 62. Thus, a bonding wire (not shown) can be led from the contact pads 9 of the second chip 63 to the respective contact pads 10 on the second surface 7 of the substrate 62. This is also clearly shown in the cross-sectional view along the lines A-A which is shown in FIG. 5B according to one embodiment of the invention.

FIG. 5C depicts the cross-sectional view along the line B-B in FIG. 5A according to one embodiment of the invention. As previously described, the first chip 61 may have its active surface facing away of the first surface 3 of the substrate 62 and consequently the contact pads 9 of the first chip 61 may also face away of the first surface 3 of the substrate 62. The substrate 62 may have contact pads 65 on its first subsurface 3 which are arranged such that a bond wire connection between the contact pad 65 and the contact pad 9 of the first chip 61 may be provided. While depicted as a two-chip configuration in FIGS. 5A-5C, according to one embodiment more than two chips may be stacked in a cross-wise manner, thereby providing an x-fold stack.

According to one embodiment of the invention, the chips in each of the described configurations may have at least one active surface on which the integrated circuit structures are disposed. In some cases, the active surface may face away from the substrate, and in some cases the active surface may face towards the substrate. Also, in some cases, one or more chips in a package may have an active face which faces away from the substrate while one or more chips in the same package may have an active face which faces towards the substrate.

While the foregoing is directed to embodiments of the present invention, other and further embodiments of the invention may be devised without departing from the basic scope thereof, and the scope thereof is determined by the claims that follow.

What is claimed is:

1. A multi-chip package, comprising:
    a substrate having opposing first and second surfaces and a plurality of contact areas disposed on the second surface of the substrate;
    a first integrated circuit positioned in a face-down position over the substrate, wherein a first surface of the first integrated circuit and the first surface of the substrate are in facing relationship with respect to one another, a second surface of the integrated circuit faces away from the substrate, and the first integrated circuit comprises a first plurality of contact pads disposed on the first surface of the first integrated circuit;
    a second integrated circuit positioned face-down over at least a portion of the first integrated circuit, wherein the second surface of the first integrated circuit is facing at least a portion of a first surface of the second integrated circuit and the second integrated circuit comprises a second plurality of contact pads disposed on the first surface of the second integrated circuit; and
    electrical conductors coupling the first and second plurality of contact pads to the plurality of contact areas disposed on the second surface of the substrate, wherein the first and second integrated circuits are cascaded, wherein:
    the first plurality of contact pads is located along a first edge of the first integrated circuit;
    the second plurality of contact pads is located along a first edge of the second integrated circuit;
    the first edge of the first integrated circuit is positioned such that the first edge of the first integrated circuit extends beyond a first edge of the substrate; and
    the first edge of the second integrated circuit is positioned such that the first edge of the second integrated circuit extends beyond the first edge of the first integrated circuit.

2. The multi-chip package of claim 1, wherein the substrate further comprises a plurality of solder balls connected to the second surface of the substrate.

3. The multi-chip package of claim 1, wherein at least one of the first plurality of contact pads and the second plurality of contact pads are part of a redistribution layer.

4. The multi-chip package of claim 1, wherein at least a portion of the first integrated circuit, second integrated circuit, and substrate are encapsulated in a mold.

5. The multi-chip package of claim 1, wherein the first and second integrated circuits are perpendicularly cascaded, and wherein the second edge of the first integrated circuit is perpendicular to the first edge of the first integrated circuit.

6. A multi-chip package, comprising:
    a substrate having a first surface, a second surface, a through-channel extending through the first surface to the second surface, and a plurality of contact areas disposed on the second surface of the substrate;
    a first integrated circuit in a face-down position over the substrate, wherein a first surface of the first integrated circuit and the first surface of the substrate are in facing relationship with respect to one another, a second surface of the integrated circuit faces away from the substrate, and the first integrated circuit comprises a first plurality of contact pads disposed on the first surface of the first integrated circuit;
    a second integrated circuit positioned face-down over at least a portion of the first integrated circuit, wherein the second surface of the first integrated circuit is facing at least a portion of a first surface of the second integrated circuit, and the second integrated circuit comprises a second plurality of contact pads disposed on the first surface of the second integrated circuit;

electrical conductors coupling the first and second plurality of contact pads to the plurality of contact areas disposed on the second surface of the substrate, wherein the electrical conductors pass through the through-channel, wherein the first and second integrated circuits are cascaded, wherein:

the first plurality of contact pads is located along a first edge of the first integrated circuit;

the second plurality of contact pads is located along a first edge of the second integrated circuit;

the first edge of the first integrated circuit is positioned such that the first edge of the first integrated circuit extends beyond a first edge of the through-channel of the substrate; and the first edge of the second integrated circuit is positioned such that the first edge of the second integrated circuit extends beyond the first edge of the first integrated circuit.

7. The multi-chip package of claim 6, wherein the first and second integrated circuits are perpendicularly cascaded, and wherein the second channel is perpendicular to the first channel.

8. The multi-chip package of claim 7, wherein the substrate further comprises a plurality of solder balls connected to the second surface of the substrate.

9. The multi-chip package of claim 7, wherein at least one of the first plurality of contact pads and the second plurality of contact pads are part of a redistribution layer.

10. A multi-chip package, comprising:

a substrate having opposing first and second surfaces, a first plurality of contact areas disposed on the second surface of the substrate, and a second plurality of contact areas disposed on the second surface of the substrate;

a first integrated circuit in a face-down position over the substrate, wherein a first surface of the first integrated circuit and the first surface of the substrate are in facing relationship with respect to one another, wherein a second surface of the integrated circuit faces away from the substrate, and the first integrated circuit comprises a first plurality of contact pads disposed on the first surface of the first integrated circuit;

a second integrated circuit positioned face-up over at least a portion of the substrate, wherein the first surface of the substrate is facing at least a portion of a first surface of the second integrated circuit and the second integrated circuit comprises a second plurality of contact pads disposed on a second surface of the second integrated circuit, wherein the first integrated circuit is positioned over at least a portion of the second integrated circuit, and wherein the second surface of the second integrated circuit faces the first surface of the first integrated circuit;

first electrical conductors coupling the first plurality of contact pads to the first plurality of contact areas underneath the substrate; and second electrical conductors coupling the second plurality of contact pads to the second plurality of contact areas, wherein the first and second integrated circuits are perpendicularly positioned, wherein:

the first plurality of contact pads is located along a first edge of the first integrated circuit;

the second plurality of contact pads is located along a first edge of the second integrated circuit;

the first integrated circuit is positioned such that the first edge of the first integrated circuit extends beyond a first edge of a first channel of the through-channel of the substrate; and the second integrated circuit is positioned such that the first edge of the second integrated circuit extends beyond a second edge of the first integrated circuit, wherein the second edge of the first integrated circuit is perpendicular to the first edge of the first integrated circuit.

11. The multi-chip package of claim 10, wherein the first integrated circuit and the second integrated circuit are on a same level with respect the substrate, such that the first surface of the first integrated circuit and the first surface of the second integrated circuit are a same distance from the first surface of the substrate.

12. The multi-chip package of claim 10, wherein the substrate further comprises a through-channel extending through the first surface of the substrate to the second surface of the substrate, and wherein the first electrical conductors connecting the first plurality of contact pads to the first plurality of contact areas pass through the through-channel.

13. The multi-chip package of claim 10, wherein the substrate further comprises a plurality of solder balls connected to the second surface of the substrate.

* * * * *